(12) United States Patent
Chiang et al.

(10) Patent No.: US 10,211,161 B2
(45) Date of Patent: Feb. 19, 2019

(54) SEMICONDUCTOR PACKAGE STRUCTURE HAVING A PROTECTION LAYER

(71) Applicant: Advanced Semiconductor Engineering, Inc., Kaohsiung (TW)

(72) Inventors: Yuan-Feng Chiang, Kaohsiung (TW); Cong-Wei Chen, Kaohsiung (TW); I-Ting Chi, Kaohsiung (TW); Shao-An Chen, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/692,947

(22) Filed: Aug. 31, 2017

(65) Prior Publication Data

US 2018/0061767 A1 Mar. 1, 2018

Related U.S. Application Data

(60) Provisional application No. 62/382,024, filed on Aug. 31, 2016.

(51) Int. Cl.
*H01L 23/29* (2006.01)
*H01L 23/31* (2006.01)
(Continued)

(52) U.S. Cl.
CPC ...... *H01L 23/5389* (2013.01); *H01L 21/4853* (2013.01); *H01L 21/4857* (2013.01); *H01L 21/561* (2013.01); *H01L 21/565* (2013.01); *H01L 21/78* (2013.01); *H01L 23/295* (2013.01); *H01L 23/3114* (2013.01); *H01L 23/49811* (2013.01); *H01L 23/5383* (2013.01); *H01L 23/5386* (2013.01); *H01L 24/19* (2013.01);
(Continued)

(58) Field of Classification Search
CPC ............... H01L 23/5389; H01L 23/295; H01L 23/3114; H01L 23/5383; H01L 23/5386; H01L 24/19; H01L 24/20; H01L 24/96; H01L 25/042; H01L 25/0655; H01L 25/072; H01L 25/0753
See application file for complete search history.

(56) References Cited

U.S. PATENT DOCUMENTS

| 8,227,927 | B2   | 7/2012  | Chen et al. |
| 8,742,579 | B2   | 6/2014  | Pagaila et al. |
| 8,772,932 | B2 * | 7/2014  | Chen ........................ H01L 24/82 257/692 |
| 8,860,217 | B1   | 10/2014 | Chen et al. |

(Continued)

FOREIGN PATENT DOCUMENTS

CN 102034799 B 12/2012

*Primary Examiner* — Ida M Soward
(74) *Attorney, Agent, or Firm* — Foley & Lardner LLP; Cliff Z. Liu

(57) ABSTRACT

A semiconductor package structure includes a semiconductor substrate, at least one semiconductor die, an encapsulant, a protection layer, a plurality of conductive elements and a redistribution layer. The semiconductor die is disposed on the semiconductor substrate. The encapsulant covers at least a portion of the semiconductor die, and has a first surface and a lateral surface. The protection layer covers the first surface and the lateral surface of the encapsulant. The conductive elements surround the lateral surface of the encapsulant. The redistribution layer electrically connects the semiconductor die and the conductive elements.

20 Claims, 17 Drawing Sheets

(51) Int. Cl.
*H01L 25/04* (2014.01)
*H01L 25/07* (2006.01)
*H01L 23/538* (2006.01)
*H01L 21/56* (2006.01)
*H01L 21/48* (2006.01)
*H01L 21/78* (2006.01)
*H01L 23/00* (2006.01)
*H01L 23/498* (2006.01)
*H01L 25/065* (2006.01)

(52) U.S. Cl.
CPC .............. *H01L 24/20* (2013.01); *H01L 24/96* (2013.01); *H01L 25/065* (2013.01); *H01L 21/568* (2013.01); *H01L 23/3128* (2013.01); *H01L 2224/19* (2013.01); *H01L 2224/214* (2013.01)

(56) References Cited

U.S. PATENT DOCUMENTS

| | | | |
|---|---|---|---|
| 8,975,741 B2* | 3/2015 | Lin | H01L 21/568 |
| | | | 257/700 |
| 9,570,418 B2* | 2/2017 | Chen | H01L 24/19 |
| 2011/0084382 A1* | 4/2011 | Chen | H01L 23/544 |
| | | | 257/737 |
| 2014/0284792 A1* | 9/2014 | Chen | H01L 23/5389 |
| | | | 257/737 |
| 2015/0115394 A1* | 4/2015 | Pagaila | H01L 21/568 |
| | | | 257/503 |
| 2015/0348912 A1* | 12/2015 | Su | H01L 21/4842 |
| | | | 257/666 |
| 2016/0293551 A1 | 10/2016 | Yap et al. | |
| 2016/0293588 A1* | 10/2016 | Lin | H01L 21/568 |
| 2017/0077022 A1* | 3/2017 | Scanlan | H01L 23/49838 |
| 2017/0256496 A1* | 9/2017 | Lin | H01L 21/4853 |
| 2017/0271248 A1* | 9/2017 | Chen | H01L 25/0657 |

* cited by examiner

SEMICONDUCTOR PACKAGE STRUCTURE HAVING A PROTECTION LAYER

CROSS-REFERENCE TO RELATED APPLICATIONS

This application claims the benefit of and priority to U.S. Provisional Patent Application 62/382,024, filed on Aug. 31, 2016, which is incorporated herein by reference in its entirety.

BACKGROUND

1. Field of the Disclosure

The present disclosure relates to a semiconductor package structure and a manufacturing method, and to a semiconductor package structure including a redistribution layer (RDL), and a method for manufacturing the semiconductor package structure.

2. Description of the Related Art

A semiconductor package structure may include a plurality of semiconductor dice. The electrical connection between the semiconductor dice can be important. In some devices, a plurality of micro bumps are used for connecting a semiconductor die to a package substrate by flip chip bonding, and a plurality of interconnection solder balls are used for connecting two semiconductor packages to form a package on package (POP) structure. However, such flip chip bonding specifies very a high die attach accuracy to avoid connection failure, and thus a low cycle time may be difficult to achieve. Further, the interconnection solder balls may increase the overall thickness of the semiconductor package structure. Improved manufacturing techniques are thus desirable.

SUMMARY

In some embodiments, according to an aspect, a semiconductor package structure includes a semiconductor substrate, at least one semiconductor die, an encapsulant, a protection layer, a plurality of conductive elements and a redistribution layer. The semiconductor die is disposed on the semiconductor substrate. The encapsulant covers at least a portion of the semiconductor die, and has a first surface and a lateral surface. The protection layer covers the first surface and the lateral surface of the encapsulant. The conductive elements surround the lateral surface of the encapsulant. The redistribution layer electrically connects the semiconductor die and the conductive elements.

In some embodiments, according to another aspect, a method for manufacturing a semiconductor package structure includes: (a) providing a plurality of semiconductor dice; (b) forming an encapsulant to cover the plurality of semiconductor dice; (c) sawing the encapsulant to form a semiconductor device, the semiconductor device including at least one of the semiconductor dice; (d) disposing the semiconductor device on a semiconductor substrate; and (e) forming a protection layer, a plurality of conductive elements and a redistribution layer, wherein the protection layer covers the semiconductor device and the semiconductor substrate, the conductive elements surround a lateral surface of the encapsulant of the semiconductor device, and the redistribution layer electrically connects the at least one semiconductor die of the semiconductor device and the conductive elements.

BRIEF DESCRIPTION OF THE DRAWINGS

Characteristics of some embodiments of the present disclosure are best understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
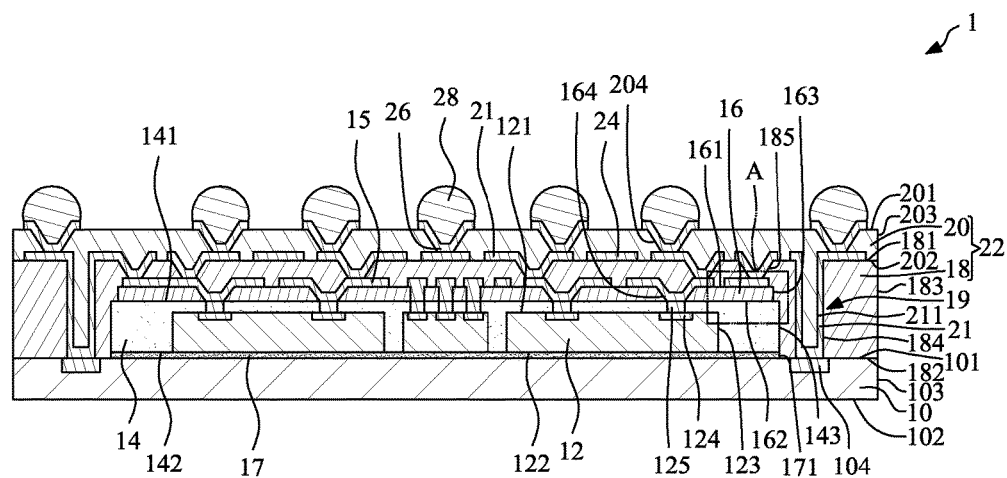
FIG. 1 illustrates a cross-sectional view of some embodiments of a semiconductor package structure according to an aspect of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

At least some embodiments of the present disclosure disclose a semiconductor package structure including a semiconductor substrate, at least one semiconductor die, a plurality of conductive elements and a redistribution layer. The semiconductor substrate may be electrically connected to the semiconductor die through the conductive elements and the redistribution layer. At least some embodiments of the present disclosure further disclose techniques for manufacturing the semiconductor package structure.

In a comparative semiconductor package structure, a plurality of semiconductor dice are attached to a package substrate by flip chip bonding. In addition, a bridge or an interconnection chip is embedded in the package substrate for electrically connecting two semiconductor dice. However, the semiconductor dice may have different sizes, and numerous die attach processes are performed for numerous dice. Each die attach may have a very high die attach accuracy to avoid connection failure, and a high cycle time may be a concern. Further, the flip chip bonding technique uses interconnection micro bumps or interconnection solder balls for connections, so that the overall thickness of the semiconductor package structure is not reduced efficiently. Furthermore, warpage issues and intermetallic compound (IMC) issues are also concerns for flip chip bonding, thereby decreasing the package reliability. Moreover, the electrical path from a first semiconductor die to a second semiconductor die is: the first semiconductor die, the interconnection micro bumps (or interconnection solder balls), the bridge (or interconnection chip), the interconnection micro bumps (or interconnection solder balls) and the second semiconductor die, which results in a long electrical routing. Therefore, electrical properties of the device are poor (e.g., a high resistive-capacitive delay (RC delay)). In addition, the micro bump or solder ball may be large, thus, the interconnection density (e.g., density of input/output (I/O) count) is limited.

The present disclosure addresses at least the above concerns and provides for an improved semiconductor package structure, and improved techniques for manufacturing the semiconductor package structure. In the semiconductor package structure, a plurality of semiconductor dice are combined into a module, and an RDL is used for interconnecting the module to a substrate, thus, the micro bump or the solder ball can be omitted.

FIG. 1 illustrates a cross-sectional view of some embodiments of a semiconductor package structure 1 according to an aspect of the present disclosure. The semiconductor package structure 1 includes a semiconductor substrate 10, at least one semiconductor die 12, an encapsulant 14, a passivation layer 16, an interconnecting circuit layer 15, an adhesive layer 17, a protection layer 22 (including, for example, a first protection layer 18 and a second protection layer 20), a plurality of conductive elements 19, an RDL 24, a plurality of under bump metallization (UBM) layers 26 and a plurality of solder balls 28.

The semiconductor substrate 10 may be a package substrate or a semiconductor die. The material of the semiconductor substrate 10 may include, for example, a semiconductor material (e.g., silicon), a glass, a ceramic, an organic material, a metal (e.g. copper (Cu), nickel (Ni), a combination of silver and tin (Ag/Sn), or palladium (Pd)), or a combination of two or more thereof. The semiconductor substrate 10 has a first surface 101, a second surface 102 and a lateral surface 103. The second surface 102 is opposite to the first surface 101, and the lateral surface 103 extends between the first surface 101 and the second surface 102. The semiconductor substrate 10 may include a plurality of pads 104 adjacent to the first surface 101. The pads 104 may be exposed from the first surface 101 and may be disposed so as to surround the encapsulant 14.

The semiconductor die 12 is disposed on the semiconductor substrate 10. As shown in FIG. 1, three semiconductor dice 12 are disposed on the semiconductor substrate 10 side by side; however, the number of the semiconductor die 12 may be one, two, four or more. In some embodiments, the sizes of the semiconductor dice 12 may be the same as or different from each other. The semiconductor die 12 has a first surface 121 (e.g., an active surface), a second surface (e.g., a back side surface) 122 and a lateral surface 123. The second surface 122 is opposite to the first surface 121, and the lateral surface 123 extends between the first surface 121 and the second surface 122. The semiconductor die 12 may include a plurality of die pads 124 and a plurality of conductive pillars 125. The die pads 124 and the conductive pillars 125 are disposed adjacent to the first surface 121. The die pads 124 may be exposed from the first surface 121, and the conductive pillars 125 are respectively disposed on a respective one of the die pads 124.

The material of the encapsulant 14 may include a molding compound. The encapsulant 14 has a first surface 141, a second surface 142 and a lateral surface 143. The second surface 142 is opposite to the first surface 141, and the lateral surface 143 extends between the first surface 141 and the second surface 142. The encapsulant 14 covers at least a portion of the semiconductor die 12. As shown in FIG. 1, the first surface 141 of the encapsulant 14 is higher than the first surface 121 of the semiconductor die 12, so that the encapsulant 14 covers the first surface 121 and the lateral surface 123 of the semiconductor die 12. Further, the second surface 122 of the semiconductor die 12 is substantially coplanar with the second surface 142 of the encapsulant 14. In other words, the second surface 122 of the semiconductor die 12 may be exposed from the second surface 142 of the encapsulant 14. Thus, a thickness of the encapsulant 14 is greater than a thickness of the semiconductor die 12. In addition, the encapsulant 14 further covers a periphery surface of each of the conductive pillars 125, and a top surface of each of the conductive pillars 125 is exposed from the encapsulant 14. In some embodiments, the top surfaces of the conductive pillars 125 are substantially coplanar with the first surface 141 of the encapsulant 14.

The passivation layer 16 may include, or be formed from, a photoresist layer, a cured photo sensitive material, a cured photoimageable dielectric (PID) material such as epoxy or polyimide (PI) including photoinitiators, or a combination of two or more thereof. The passivation layer 16 is disposed on the first surface 141 of the encapsulant 14, and has a first surface 161, a second surface 162 and a lateral surface 163. The second surface 162 is opposite to the first surface 161, and the lateral surface 163 extends between the first surface 161 and the second surface 162. The second surface 162 of the passivation layer 16 may contact the first surface 141 of the encapsulant 14. In some embodiments, the lateral surface 163 of the passivation layer 16 may not be coplanar with the lateral surface 143 of the encapsulant 14. In other words, there may be a step between the lateral surface 163 of the passivation layer 16 and the lateral surface 143 of the encapsulant 14. Thus, a length of the passivation layer 16 may be smaller than a length of the encapsulant 14 from a top view. In addition, the passivation layer 16 may define a plurality of openings 164. Each of the openings 164 extends through the passivation layer 16 so as to expose the top surface of a respective one of the conductive pillars 125.

The interconnecting circuit layer 15 is disposed on the passivation layer 16 and in the openings 164 so as to electrically and/or physically connect at least some of the conductive pillars 125. Thus, the semiconductor dice 12 may be electrically connected to each other by the interconnecting circuit layer 15 (e.g. rather than by interconnection micro bumps (or interconnection solder balls)). In some embodiments, the interconnecting circuit layer 15 may be a patterned circuit layer or an RDL with a line width/line space (L/S) of about 2 micrometers (μm)/about 2 μm.

The adhesive layer 17 is interposed between the second surface 142 of the encapsulant 14 and the first surface 101 of the semiconductor substrate 10. In other words, the encapsulant 14 and the semiconductor die 12 are adhered to the semiconductor substrate 10 by the adhesive layer 17. As shown in FIG. 1, the adhesive layer 17 may contact the second surface 122 of the semiconductor die 12. The adhesive layer 17 has a lateral surface 171 that is substantially coplanar with the lateral surface 143 of the encapsulant 14. In some embodiments, the adhesive layer 17 may be a thermal release film. In other words, the adhesive layer 17 may be a tape that is not sticky at room temperature and becomes adhesive after heating. The adhesive layer 17 may protect a circuit layer on the first surface 101 of the semiconductor substrate 10.

The protection layer 22 covers the first surface 141 and the lateral surface 143 of the encapsulant 14. As shown in FIG. 1, the protection layer 22 includes the first protection layer 18 and the second protection layer 20. The first protection layer 18 may include, or be formed from, a photoresist layer, a cured photo sensitive material, a cured photoimageable dielectric (PID) material such as epoxy or polyimide (PI) including photoinitiators, or a combination of two or more thereof. In some embodiments, the material of the protection layer 22 (including, for example, the first protection layer 18 and the second protection layer 20) may be the same as or different from the material of the passivation layer 16. The material of the protection layer 22 (including, for example, the first protection layer 18 and the second protection layer 20) may be different from the material of the encapsulant 14. For example, the encapsulant 14 may include fillers and the protection layer 22 (including, for example, the first protection layer 18 and the second protection layer 20) may not include any fillers.

The first protection layer 18 has a first surface 181, a second surface 182 and a lateral surface 183. The second surface 182 is opposite to the first surface 181, and the lateral surface 183 extends between the first surface 181 and the second surface 182. The first protection layer 18 is disposed on the first surface 161 of the passivation layer 16 and covers the interconnecting circuit layer 15. In other words, the passivation layer 16 is interposed between at least a portion of the first protection layer 18 and the encapsulant 14. However, in some embodiments, the passivation layer 16 may be omitted, and the first protection layer 18 may cover and contact the first surface 141 of the encapsulant 14.

As shown in FIG. 1, the first protection layer 18 covers and contacts the lateral surface 163 of the passivation layer 16, the lateral surface 143 of the encapsulant 14 and the lateral surface 171 of the adhesive layer 17. In addition, the second surface 182 the first protection layer 18 covers and contacts a portion of the first surface 101 of the semiconductor substrate 10. The first protection layer 18 defines a plurality of first openings 184 and a plurality of second openings 185. Each of the first openings 184 extends through the first protection layer 18 from the first surface 181 to the second surface 182, and is disposed at a location corresponding to the pad 104 of the semiconductor substrate 10 so as to expose the pad 104. Thus, the first openings 184 are through holes surrounding the encapsulant 14 and the semiconductor die 12, and a depth of each of the first openings 184 is greater than a thickness of the encapsulant 14. The second openings 185 are disposed at the locations corresponding to the interconnecting circuit layer 15 so as to expose portions of the interconnecting circuit layer 15.

A metal layer 21 is disposed on the first surface 181 of the first protection layer 18 and in the first openings 184 and the second openings 185. A first portion of the metal layer 21 that is disposed in the first openings 184 constitutes at least part of the conductive elements 19 surrounding the lateral surface 143 of the encapsulant 14. The conductive elements 19 are conductive vias that contact the pads 104 of the semiconductor substrate 10. A length of each of the conductive elements 19 is greater than a thickness of the encapsulant 14. As shown in FIG. 1, the first portion of the metal layer 21 is disposed on a side wall surface and a bottom surface of the first opening 184 of the first protection layer 18, and defines a cavity 211. In some embodiments, the first portion of the metal layer 21 may substantially fill the first opening 184. The conductive elements 19 are disposed on the first protection layer 18, and electrically connect the semiconductor die 12 and the semiconductor substrate 10.

A second portion of the metal layer 21 that is on the first surface 181 of the first protection layer 18 and in the second openings 185 constitutes at least part of the RDL 24. In other words, the conductive elements 19 and the RDL 24 may be formed concurrently at one process stage. The RDL 24 may be a patterned circuit layer. The RDL 24 is disposed on the first protection layer 18 and contacts the interconnecting circuit layer 15 in the second openings 185, so that the RDL 24 electrically connects the semiconductor die 12 and the conductive elements 19. A line width/line space (L/S) of the RDL 24 is greater than the line width/line space (L/S) of the interconnecting circuit layer 15. For example, the line width/line space (L/S) of the RDL 24 may be about 5 µm/about 5 µm or about 7 µm/about 7 m.

The second protection layer 20 may include, or be formed from, a photoresist layer, a cured photo sensitive material, a cured photoimageable dielectric (PID) material such as epoxy or polyimide (PI) including photoinitiators, or a combination of two or more thereof. The material of the second protection layer 20 may be the same as or different from the material of the first protection layer 18. The second protection layer 20 has a first surface 201, a second surface 202 and a lateral surface 203. The second surface 202 is opposite to the first surface 201, and the lateral surface 203 extends between the first surface 201 and the second surface 202. The second protection layer 20 is disposed on the first surface 181 of the first protection layer 18, and covers the RDL 24 and the conductive elements 19. In some embodiments, a portion of the second protection layer 20 extends into and is disposed in the cavity 211 defined by the metal layer 21 in the conductive element 19. Thus, the conductive elements 19 are embedded in the protection layer 22. As shown in FIG. 1, the second protection layer 20 defines a plurality of openings 204 to expose portions of the RDL 24.

The UBM layers 26 are respectively disposed in respective ones of the openings 204 of the second protection layer 20, and physically connected to the exposed RDL 24. The solder balls 28 are respectively disposed on respective ones of the UBM layers 26 in the openings 204 for external connection, and are electrically connected to the RDL 24 through the UBM layers 26.

According to at least some embodiments of the present disclosure, as shown in the embodiments illustrated in FIG. 1, since the semiconductor die 12 is electrically connected to the semiconductor substrate 10 by the interconnecting circuit layer 15, the RDL 24 and the conductive element 19, the flip chip bonding technique need not be used. Thus, interconnection micro bumps (or interconnection solder balls) may be omitted, so that the overall thickness of the semiconductor package structure 1 can be reduced efficiently, and the interconnection density (e.g., density of input/output (I/O) count) is high. During a manufacturing process, the semiconductor dice 12 are first combined into a module, then the module is adhered to the semiconductor substrate 10. Thus, even if the semiconductor dice 12 have different sizes, no numerous die attach processes are needed for the numerous dice. Thereby, the cycle time is improved. Furthermore, warpage issues and intermetallic compound (IMC) issues can be avoided, thereby increasing the package reliability. Moreover, the electrical path from the semiconductor die 12 to the semiconductor substrate 10 is short, as compared to some comparative examples, which results in a short electrical routing. Therefore, electrical properties of the device are excellent (e.g., a low resistive-capacitive delay (RC delay)).

Figure 2:
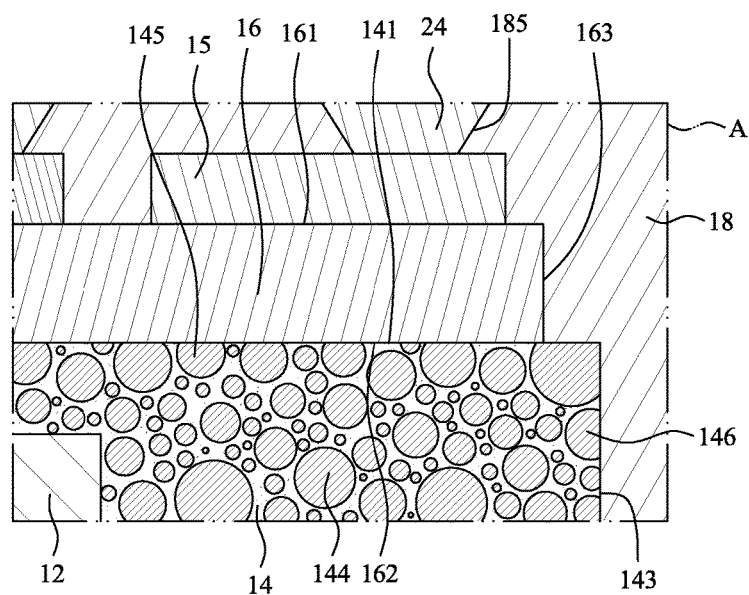
FIG. 2 illustrates an enlarged view of an area A in FIG. 1.

FIG. 2 illustrates an enlarged view of an area A in FIG. 1. The encapsulant 14 includes a plurality of fillers (including, for example, a plurality of first fillers 144, a plurality of second fillers 145 and a plurality of third fillers 146). Each of the first fillers 144 is substantially a complete sphere or particle without being cut, sawed or ground. During a manufacturing process, the first surface 141 of the encapsulant 14 is formed by grinding, thus, the second fillers 145 are ground to be a plurality of incomplete spheres or particles. In other words, a portion of each of the second fillers 145 is removed, and another portion of each of the second fillers 145 remains in the encapsulant 14. As a result, a cross-sectional surface of each of the second fillers 145 is exposed from the first surface 141 of the encapsulant 14, and the cross-sectional surface can be substantially planar. In addition, the lateral surface 143 of the encapsulant 14 is formed by sawing, thus, the third fillers 146 are sawn to be a plurality of incomplete spheres or particles. In other words, a portion of each of the third fillers 146 is removed away, and another portion of each of the third fillers 146 remains in the encapsulant 14. As a result, a cross-sectional surface of each of the third fillers 146 is exposed from the lateral surface 143 of the encapsulant 14, and the cross-sectional surface can be substantially planar. It is noted that a value of a surface roughness of the lateral surface 143 of the encapsulant 14 is greater than a value of a surface roughness of the first surface 141 of the encapsulant 14.

Figure 3:
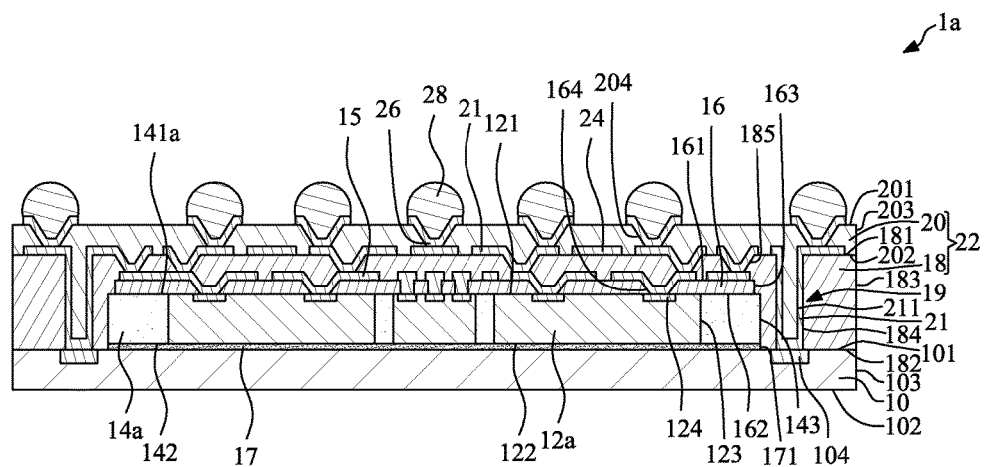
FIG. 3 illustrates a cross-sectional view of some embodiments of a semiconductor package structure according to an aspect of the present disclosure.

FIG. 3 illustrates a cross-sectional view of some embodiments of a semiconductor package structure 1a, according to an aspect of the present disclosure. The semiconductor package structure 1a, of FIG. 3 is similar to the semiconductor package structure 1 as shown in FIG. 1, except that the conductive pillars 125 of the semiconductor die 12a are omitted. Further, the first surface 141a of the encapsulant 14a is substantially coplanar with the first surface 121 of the semiconductor die 12a, so that the thickness of the encapsulant 14a is substantially coplanar with the thickness of the semiconductor die 12a. The second surface 162 of the passivation layer 16 may contact the first surface 141a of the encapsulant 14a and the first surface 121 of the semiconductor die 12. Each of the openings 164 of the passivation layer 16 exposes a respective one of the die pads 124 of the semiconductor die 12a. The interconnecting circuit layer 15 is disposed on the passivation layer 16 and in the openings 164 so as to electrically and physically connect the die pads 124 of the semiconductor die 12a.

Figure 4:
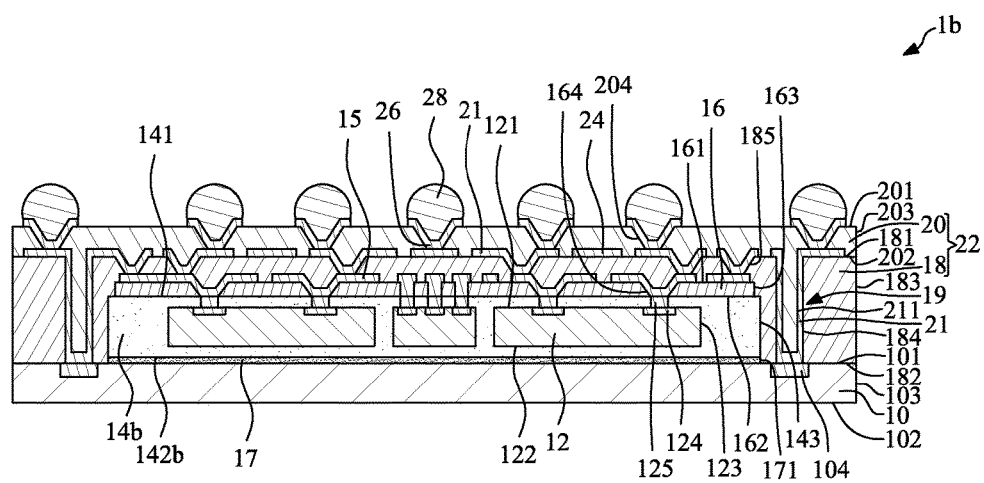
FIG. 4 illustrates a cross-sectional view of some embodiments of a semiconductor package structure according to an aspect of the present disclosure.

FIG. 4 illustrates a cross-sectional view of some embodiments of a semiconductor package structure 1b according to an aspect of the present disclosure. The semiconductor package structure 1b of FIG. 4 is similar to the semiconductor package structure 1 as shown in FIG. 1, except that the encapsulant 14b of FIG. 4 is thicker than the encapsulant 14 of FIG. 1. As shown in FIG. 4, the second surface 142b of the encapsulant 14b is lower than the second surface 122 of the semiconductor die 12. The encapsulant 14b further covers the second surface 122 of the semiconductor die 12, and the adhesive layer 17 is attached to the second surface 142b of the encapsulant 14b (and not, for example, to the surface 122 of the semiconductor die 12).

Figure 5:
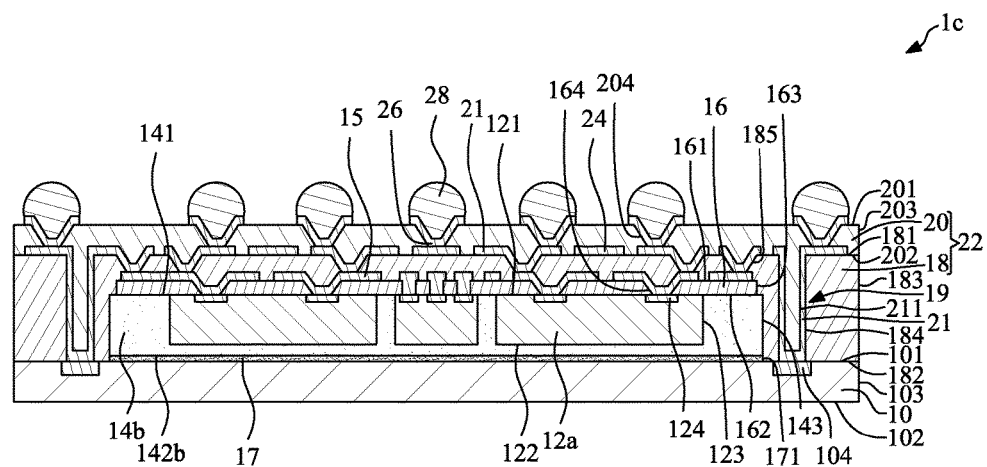
FIG. 5 illustrates a cross-sectional view of some embodiments of a semiconductor package structure according to an aspect of the present disclosure.

FIG. 5 illustrates a cross-sectional view of some embodiments of a semiconductor package structure 1c according to an aspect of the present disclosure. The semiconductor package structure 1c of FIG. 5 is similar to the semiconductor package structure 1a, as shown in FIG. 3, except that the encapsulant 14b of FIG. 5 is thicker than the encapsulant 14a of FIG. 3. As shown in FIG. 5, the second surface 142b of the encapsulant 14b is lower than the second surface 122 of the semiconductor die 12a. The encapsulant 14b further covers the second surface 122 of the semiconductor die 12a, and the adhesive layer 17 is attached to the second surface 142b of the encapsulant 14b (and not, for example, to the surface 122 of the semiconductor die 12).

Figure 6:
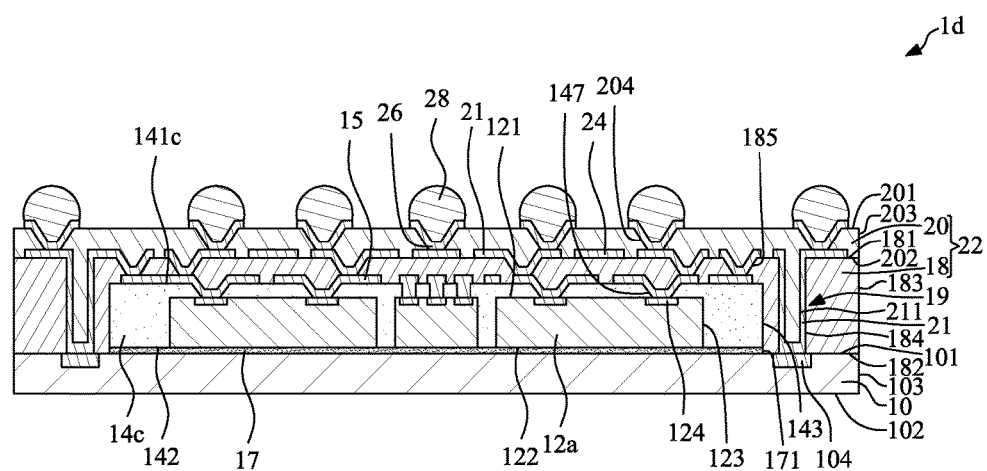
FIG. 6 illustrates a cross-sectional view of some embodiments of a semiconductor package structure according to an aspect of the present disclosure.

FIG. 6 illustrates a cross-sectional view of some embodiments of a semiconductor package structure 1d according to an aspect of the present disclosure. The semiconductor package structure 1d of FIG. 6 is similar to the semiconductor package structure 1a, as shown in FIG. 3, except that that the passivation layer 16 is omitted. Further, as shown in FIG. 6, the first surface 141c of the encapsulant 14c is higher than the first surface 121 of the semiconductor die 12a, so that the encapsulant 14c covers and contacts the first surface 121 and the lateral surface 123 of the semiconductor die 12a. The encapsulant 14c defines a plurality of openings 147 recessed from the first surface 141c. Each of the openings 147 of the encapsulant 14c exposes a respective one of the die pads 124 of the semiconductor die 12a. The interconnecting circuit layer 15 is disposed on the encapsulant 14c and in the openings 147 so as to electrically and physically connect the die pads 124 of the semiconductor die 12a.

Figure 7:
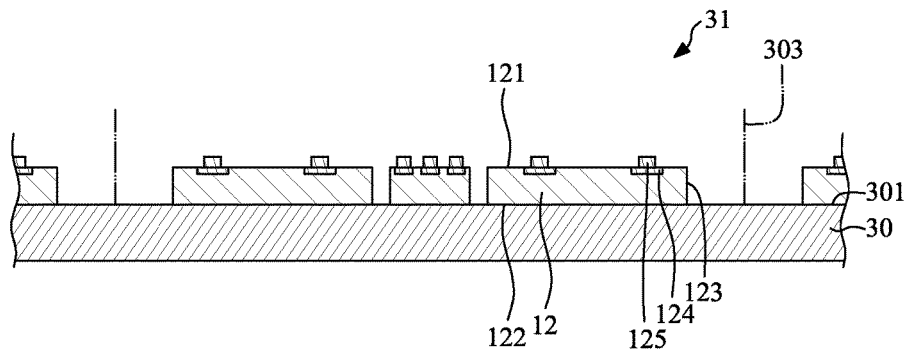
FIG. 7 illustrates one or more stages of some embodiments of a method for manufacturing a semiconductor package structure according to an aspect of the present disclosure.

FIG. 7 through FIG. 21 illustrate various stages of some embodiments of a method for manufacturing a semiconductor package structure according to an aspect of the present disclosure. In some embodiments, the method is for manufacturing a semiconductor package structure such as the semiconductor package structure 1 shown in FIG. 1 and FIG. 2. Referring to FIG. 7, a carrier 30 is provided. The carrier 30 may be, for example, a metal material, a ceramic material, a glass material, a substrate or a semiconductor wafer. The carrier 30 has a first surface 301.

Then, a plurality of semiconductor dice 12 are disposed on the carrier 30. As shown in FIG. 7, three semiconductor dice 12 are disposed on the carrier 30 next to each other in a unit area 31 defined by cutting lines 303; however, the number of the semiconductor die 12 may be one, two, four or more. In some embodiments, the sizes of the semiconductor dice 12 may be the same as or different from each other. The semiconductor die 12 has a first surface 121 (e.g., an active surface), a second surface (e.g., a back side surface) 122 and a lateral surface 123. The second surface 122 is opposite to the first surface 121, and the lateral surface 123 extends between the first surface 121 and the second surface 122. The semiconductor die 12 may include a plurality of die pads 124 and a plurality of conductive pillars 125. The die pads 124 and the conductive pillars 125 are disposed adjacent to the first surface 121. The die pads 124 may be exposed from the first surface 121, and the conductive pillars 125 are disposed on a respective one of the die pads 124. In some embodiments, the second surface 122 of the semiconductor die 12 is attached or adhered to the first surface 301 of the carrier 30, and such process is referred to as a "face up process."

Figure 8:
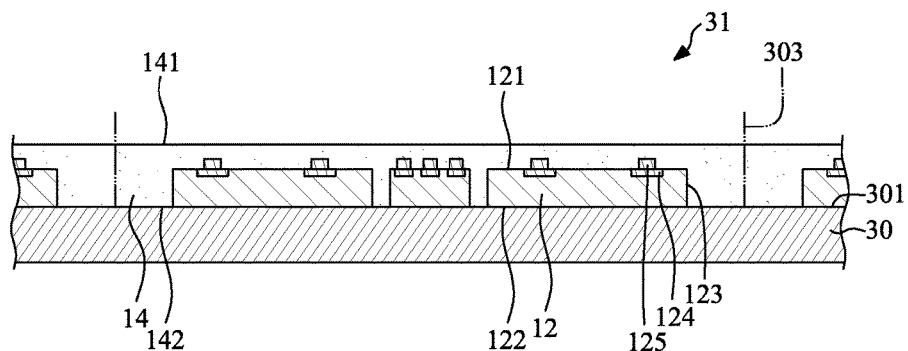
FIG. 8 illustrates one or more stages of some embodiments of a method for manufacturing a semiconductor package structure according to an aspect of the present disclosure.

Referring to FIG. 8, an encapsulant 14 is formed or disposed on the first surface 301 of the carrier 30 to cover the semiconductor dice 12. The material of the encapsulant 14 may include a molding compound. The encapsulant 14 has a first surface 141 and a second surface 142 opposite to the first surface 141. As shown in FIG. 8, the first surface 141 of the encapsulant 14 is higher than the first surface 121 of the semiconductor die 12, so that the encapsulant 14 covers the first surface 121 and the lateral surface 123 of the semiconductor die 12. Further, the second surface 122 of the semiconductor die 12 is substantially coplanar with the second surface 142 of the encapsulant 14. In addition, the encapsulant 14 further covers the conductive pillars 125.

Figure 9:
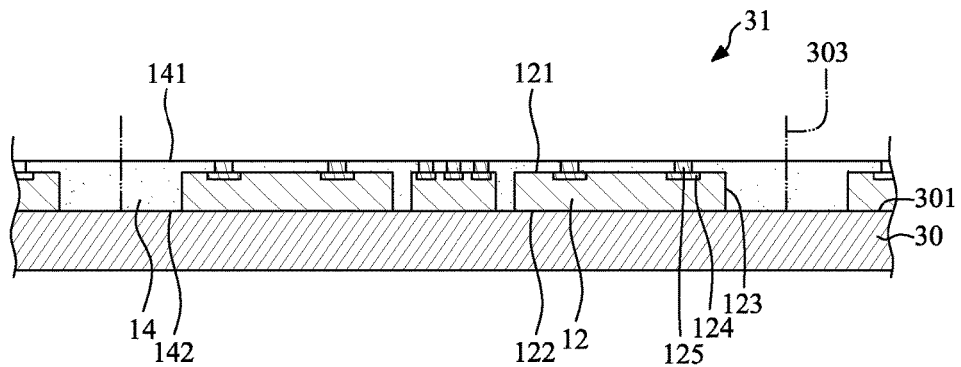
FIG. 9 illustrates one or more stages of some embodiments of a method for manufacturing a semiconductor package structure according to an aspect of the present disclosure.

Referring to FIG. 9, a top portion of the encapsulant 14 is removed by grinding so that the encapsulant 14 is thinned. Meanwhile, a top surface of each of the conductive pillars 125 is exposed from the first surface 141 of encapsulant 14. In some embodiments, the top surfaces of the conductive pillars 125 are substantially coplanar with the first surface 141 of the encapsulant 14.

Figure 10:
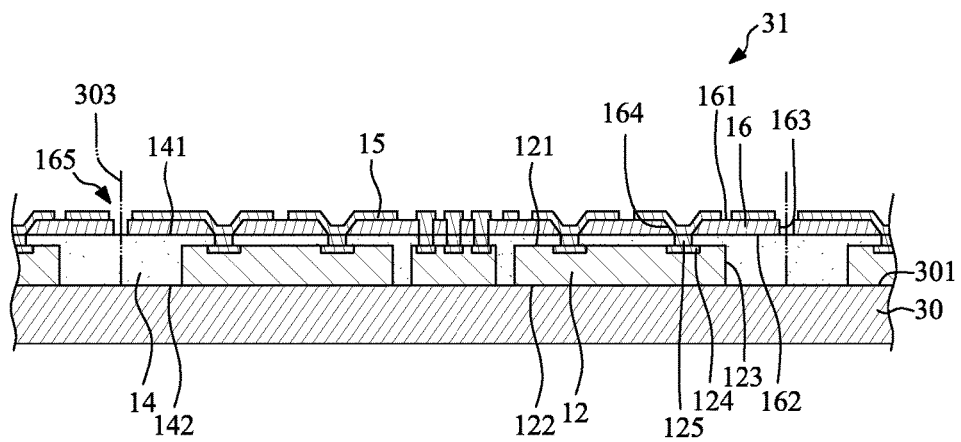
FIG. 10 illustrates one or more stages of some embodiments of a method for manufacturing a semiconductor package structure according to an aspect of the present disclosure.

Referring to FIG. 10, a plurality of passivation layers 16 is formed or disposed on the first surface 141 of the encapsulant 14. In some embodiments, the passivation layers 16 do not completely cover the entire first surface 141 of the encapsulant 14. The passivation layer 16 in one unit area 31 does not extend to an adjacent unit area 31. In other words, a length of the passivation layer 16 is slightly smaller than a length of the unit area 31 form a top view. Thus, the passivation layer 16 in one unit area 31 does not connect to the passivation layer 16 in the adjacent unit area 31, and there is a gap 165 between two adjacent passivation layers 16. Portions of the first surface 141 of the encapsulant 14 under the gaps 165 are exposed. The locations of the gaps 165 correspond to the cutting lines 303.

The passivation layer 16 may include, or be formed from, a photoresist layer, a cured photo sensitive material, a cured photoimageable dielectric (PID) material such as epoxy or polyimide (PI) including photoinitiators, or a combination of two or more thereof. The passivation layer 16 has a first surface 161, a second surface 162 and a lateral surface 163. The second surface 162 is opposite to the first surface 161, and the lateral surface 163 extends between the first surface 161 and the second surface 162. The second surface 162 of the passivation layer 16 may contact the first surface 141 of the encapsulant 14. In addition, the passivation layer 16 may define a plurality of openings 164. Each of the openings 164 extends through the passivation layer 16 so as to expose the top surface of a respective one of the conductive pillars 125.

Then, an interconnecting circuit layer 15 is formed or disposed on the passivation layer 16 and in the openings 164 so as to electrically and physically connect the conductive pillars 125. Thus, the semiconductor dice 12 may be electrically connected to each other by the interconnecting circuit layer 15 rather than interconnection micro bumps (or interconnection solder balls). In some embodiments, the interconnecting circuit layer 15 may be a patterned circuit layer or an RDL with a line width/line space (L/S) of about 2 μm/about 2 μm.

Figure 11:
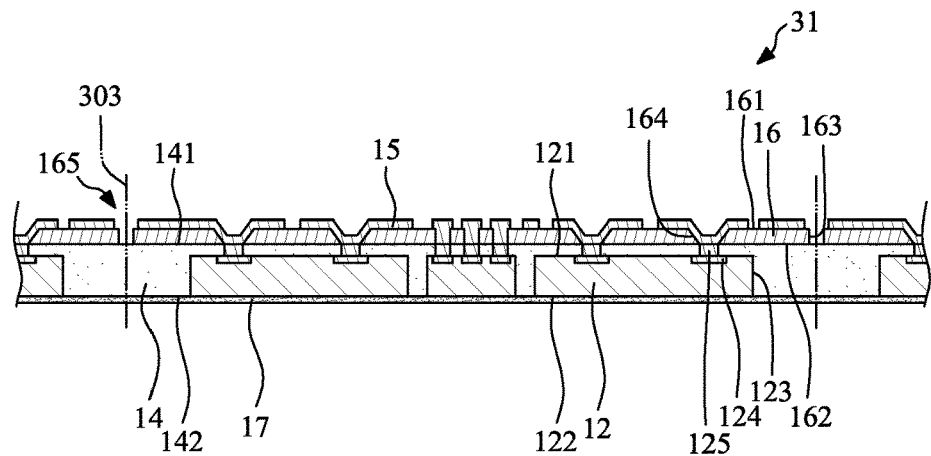
FIG. 11 illustrates one or more stages of some embodiments of a method for manufacturing a semiconductor package structure according to an aspect of the present disclosure.

Referring to FIG. 11, the carrier 30 is removed by, for example, stripping, so that the second surface 122 of the semiconductor die 12 is substantially coplanar with the second surface 142 of the encapsulant 14. In other words, the second surface 122 of the semiconductor die 12 may be exposed from the second surface 142 of the encapsulant 14. Then, an adhesive layer 17 is formed or disposed on the second surface 142 of the encapsulant 14 and the second surface 122 of the semiconductor die 12. In some embodiments, the adhesive layer 17 may be a thermal release film. In other words, the adhesive layer 17 may be a tape that is not sticky at room temperature and becomes adhesive after heating.

Figure 12:
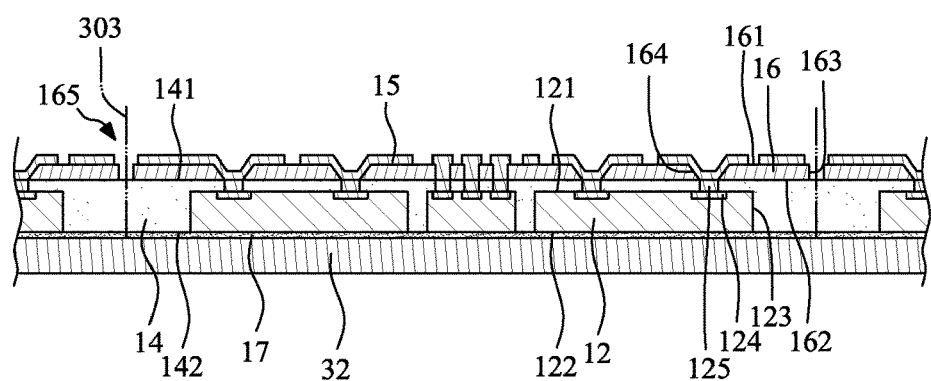
FIG. 12 illustrates one or more stages of some embodiments of a method for manufacturing a semiconductor package structure according to an aspect of the present disclosure.

Referring to FIG. 12, the encapsulant 14, the semiconductor die 12 and the adhesive layer 17 are attached to a dicing tape 32.

Figure 13:
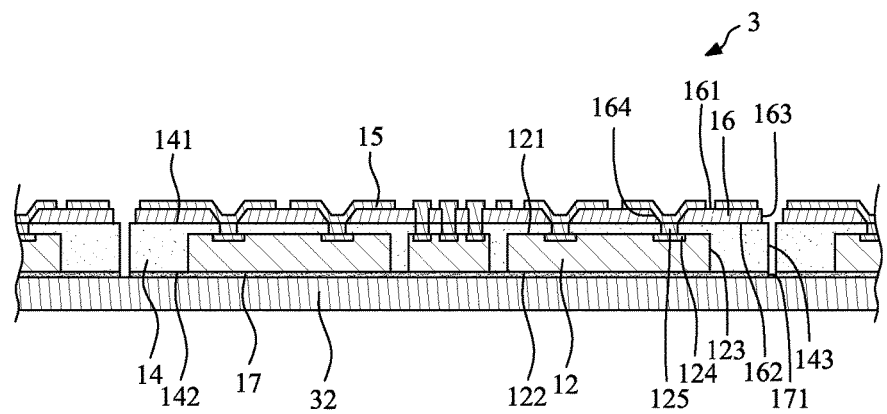
FIG. 13 illustrates one or more stages of some embodiments of a method for manufacturing a semiconductor package structure according to an aspect of the present disclosure.

Referring to FIG. 13, a singulation process is conducted by sawing the encapsulant 14 and the adhesive layer 17 by blade along the cutting lines 303 to form a plurality of semiconductor devices 3. The semiconductor devices 3 are modules, and include the encapsulant 14, the semiconductor dice 12, the passivation layer 16, the interconnecting circuit layer 15 and the adhesive layer 17. In the semiconductor devices 3, the encapsulant 14 has a lateral surface 143 extending between the first surface 141 and the second surface 142, the adhesive layer 17 has a lateral surface 171 that is substantially coplanar with the lateral surface 143 of the encapsulant 14. In some embodiments, the lateral surface 163 of the passivation layer 16 may not substantially coplanar with the lateral surface 143 of the encapsulant 14. In other words, there may be a step between the lateral surface 163 of the passivation layer 16 and the lateral surface 143 of the encapsulant 14. Thus, a length of the passivation layer 16 may be smaller than a length of the encapsulant 14 from a top view.

Figure 14:
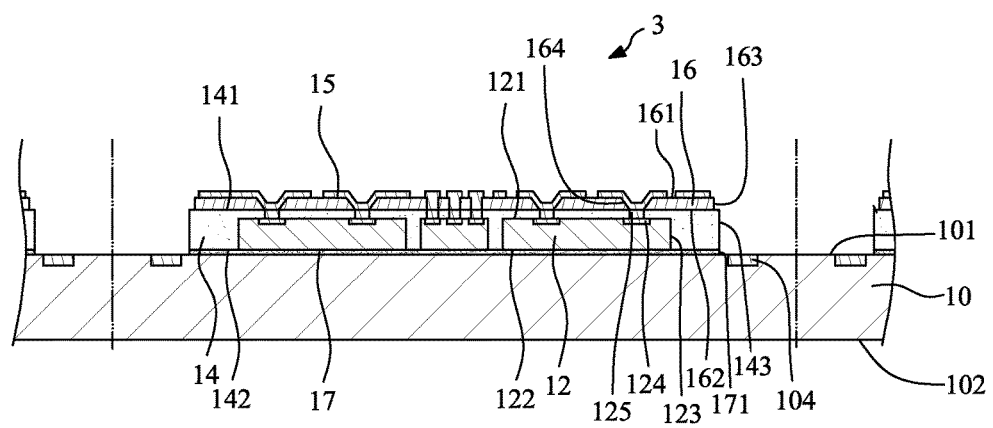
FIG. 14 illustrates one or more stages of some embodiments of a method for manufacturing a semiconductor package structure according to an aspect of the present disclosure.

Referring to FIG. 14, the semiconductor devices 3 are disposed on a semiconductor substrate 10. In some embodiments, the semiconductor devices 3 are adhered to the semiconductor substrate 10 through the adhesive layer 17. The semiconductor substrate 10 may be a package substrate or a semiconductor die. The material of the semiconductor substrate 10 may include, for example, a semiconductor material (e.g., silicon), a glass, a ceramic, an organic material, a metal (e.g. copper (Cu), nickel (Ni), a combination of silver and tin (Ag/Sn), or palladium (Pd)), or a combination of two or more thereof. The semiconductor substrate 10 has a first surface 101 and a second surface 102 opposite to the first surface 101. The semiconductor substrate 10 may include a plurality of pads 104 adjacent to the first surface 101. The pads 104 may be exposed from the first surface 101 and surround the encapsulant 14. In other words, the encapsulant 14 and the adhesive layer 17 may not completely cover the pads 104. If there is a circuit layer on the first surface 101 of the semiconductor substrate 10, the adhesive layer 17 can protect such circuit layer. As shown in FIG. 14, three semiconductor dice 12 are disposed on the semiconductor substrate 10 side by side.

Figure 15:
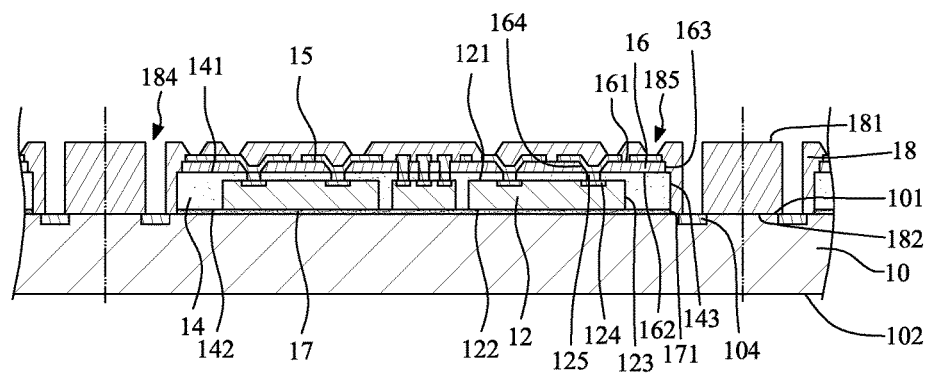
FIG. 15 illustrates one or more stages of some embodiments of a method for manufacturing a semiconductor package structure according to an aspect of the present disclosure.
Figure 16:
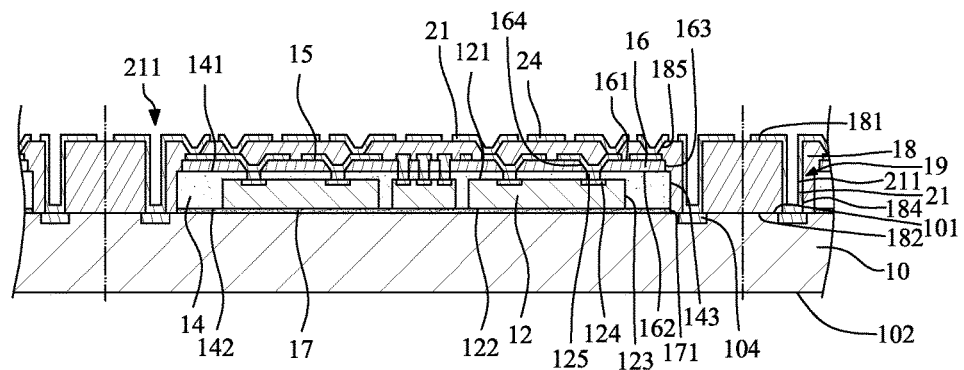
FIG. 16 illustrates one or more stages of some embodiments of a method for manufacturing a semiconductor package structure according to an aspect of the present disclosure.
Figure 17:
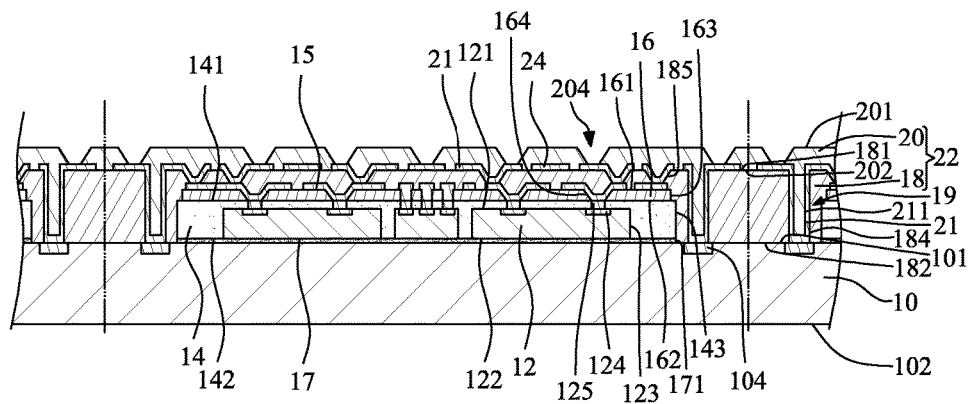
FIG. 17 illustrates one or more stages of some embodiments of a method for manufacturing a semiconductor package structure according to an aspect of the present disclosure.

Referring to FIG. 15 through FIG. 17, a protection layer 22 (including, for example, a first protection layer 18 and a second protection layer 20, as shown in FIG. 17), a plurality of conductive elements 19 and an RDL 24 are formed as follows, wherein the protection layer 22 covers the first surface 141 and the lateral surface 143 of the encapsulant 14.

Referring to FIG. 15, the first protection layer 18 covers the semiconductor device 3. The first protection layer 18 is formed or disposed on the first surface 161 of the passivation layer 16 and covers the interconnecting circuit layer 15. The passivation layer 16 is interposed between the first protection layer 18 and the encapsulant 14. However, in some embodiments, the passivation layer 16 may be omitted, and the first protection layer 18 may cover and contact the first surface 141 of the encapsulant 14. The first protection layer 18 may include, or be formed from, a photoresist layer, a cured photo sensitive material, a cured photoimageable dielectric (PID) material such as epoxy or polyimide (PI) including photoinitiators, or a combination of two or more thereof. In in some embodiments, the material of the protection layer 22 (including, for example, the first protection layer 18 and the second protection layer 20) may be the same as or different from the material of the passivation layer 16. The material of the protection layer 22 (including, for example, the first protection layer 18 and the second protection layer 20) may be different from the material of the encapsulant 14. For example, the encapsulant 14 may include fillers and the protection layer 22 (including, for example, the first protection layer 18 and the second protection layer 20) may not include any fillers.

The first protection layer 18 has a first surface 181 and a second surface 182 opposite to the first surface 181. As shown in FIG. 15, the first protection layer 18 covers and contacts the lateral surface 163 of the passivation layer 16, the lateral surface 143 of the encapsulant 14 and the lateral surface 171 of the adhesive layer 17. In addition, the second surface 182 the first protection layer 18 covers and contacts a portion of the first surface 101 of the semiconductor substrate 10. The first protection layer 18 defines a plurality of first openings 184 and a plurality of second openings 185. Each of the first openings 184 extends through the first protection layer 18 from the first surface 181 to the second surface 182, and is disposed at the location corresponding to the pad 104 of the semiconductor substrate 10 so as to expose the pad 104. The first openings 184 are through holes surrounding the encapsulant 14 and the semiconductor die 12, and a depth of each of the first openings 184 is greater than a thickness of the encapsulant 14. The second openings 185 are disposed at the locations corresponding to the interconnecting circuit layer 15 so as to expose portions of the interconnecting circuit layer 15.

Referring to FIG. 16, a metal layer 21 (e.g., a copper layer) is formed or disposed on the first surface 181 of the first protection layer 18 and in the first openings 184 and the second openings 185. A first portion of the metal layer 21 that is disposed in the first openings 184 constitutes at least part of the conductive elements 19 surrounding the lateral surface 143 of the encapsulant 14 of the semiconductor device 3. The conductive elements 19 are conductive vias that contact the pads 104 of the semiconductor substrate 10. A length of each of the conductive elements 19 is greater than a thickness of the encapsulant 14. As shown in FIG. 16, the first portion of the metal layer 21 is disposed on a side wall surface and a bottom surface of the first opening 184 of the first protection layer 18, and defines a cavity 211. In some embodiments, the first portion of the metal layer 21 may substantially fill the first opening 184. The conductive elements 19 are formed or disposed on the first protection layer 18, and electrically connect the semiconductor die 12 and the semiconductor substrate 10.

A second portion of the metal layer 21 that is on the first surface 181 of the first protection layer 18 and in the second openings 185 is patterned to form the RDL 24. In other words, the conductive elements 19 and the RDL 24 may be formed concurrently at one process stage. The RDL 24 may be a patterned circuit layer. The RDL 24 is disposed on the first protection layer 18 and contacts the interconnecting circuit layer 15 in the second openings 185, so that the RDL 24 electrically connects the semiconductor die 12 of the semiconductor device 3 and the conductive elements 19. A line width/line space (L/S) of the RDL 24 is greater than the line width/line space (L/S) of the interconnecting circuit layer 15. For example, the line width/line space (L/S) of the RDL 24 may be about 5 μm/about 5 μm or about 7 μm/about 7 μm.

Referring to FIG. 17, a second protection layer 20 is formed or disposed on the first surface 181 of the first protection layer 18, and covers the RDL 24 and the conductive elements 19. It is noted that the second protection layer 20 and the first protection layer 18 form the protection layer 22. The second protection layer 20 may include, or be formed from, a photoresist layer, a cured photo sensitive material, a cured photoimageable dielectric (PID) material such as epoxy or polyimide (PI) including photoinitiators, or a combination of two or more thereof. The material of the second protection layer 20 may be the same as or different from the material of the first protection layer 18. The second protection layer 20 has a first surface 201 and a second surface 202 opposite to the first surface 201. In some embodiments, a portion of the second protection layer 20 extends into and is disposed in the cavity 211 defined by the metal layer 21 in the conductive element 19. Thus, the RDL 24 and the conductive elements 19 are embedded in the protection layer 22. As shown in FIG. 17, the second protection layer 20 defines a plurality of openings 204 to expose portions of the RDL 24.

Figure 18:
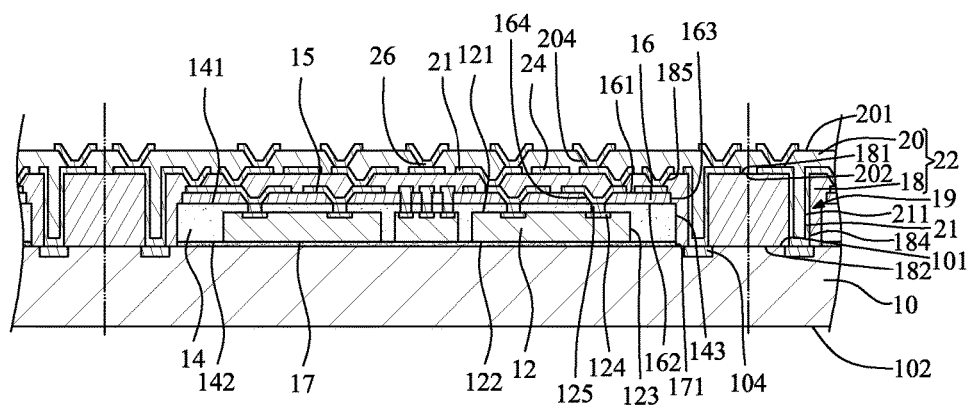
FIG. 18 illustrates one or more stages of some embodiments of a method for manufacturing a semiconductor package structure according to an aspect of the present disclosure.

Referring to FIG. 18, a plurality of UBM layers 26 are respectively formed or disposed in a respective one of the openings 204 of the second protection layer 20, and physically connected to the exposed RDL 24. It is noted that the UBM layers 26 may be included in another RDL.

Figure 19:
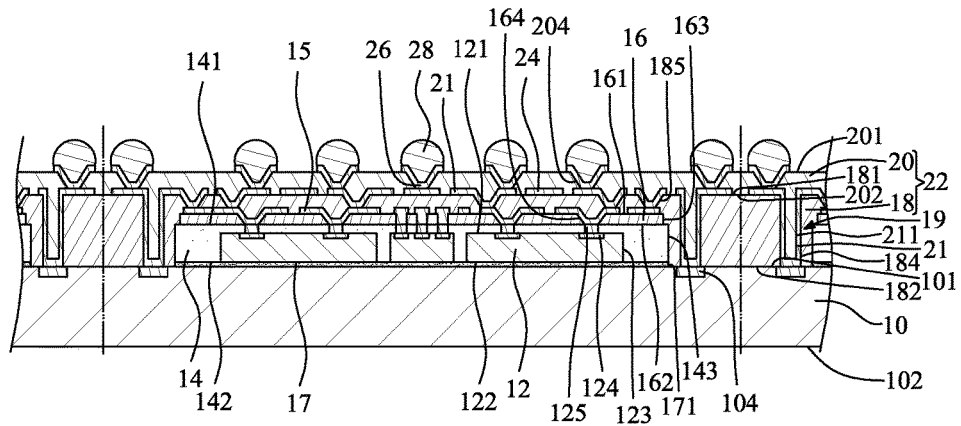
FIG. 19 illustrates one or more stages of some embodiments of a method for manufacturing a semiconductor package structure according to an aspect of the present disclosure.

Referring to FIG. 19, a plurality of solder balls 28 are respectively formed or disposed on a respective one of the UBM layers 26 in the openings 204 for external connection, and are electrically connected to the RDL 24 through the UBM layers 26.

Figure 20:
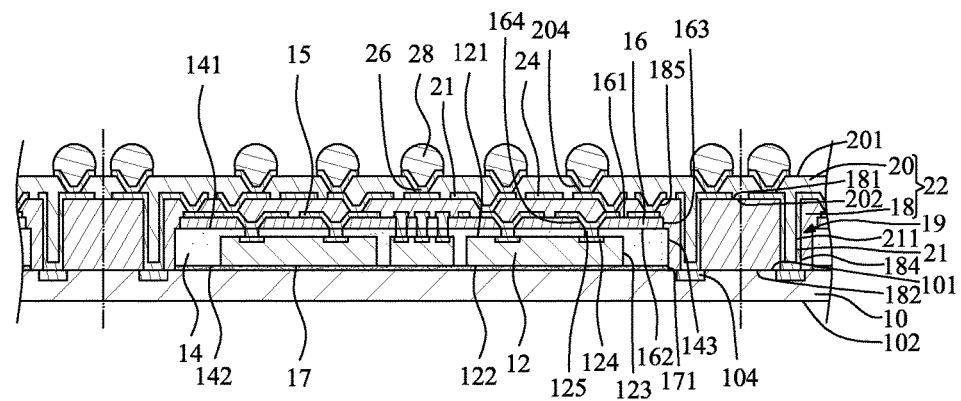
FIG. 20 illustrates one or more stages of some embodiments of a method for manufacturing a semiconductor package structure according to an aspect of the present disclosure.

Referring to FIG. 20, the semiconductor substrate 10 is thinned from its second surface 102. In other words, the bottom portion of the semiconductor substrate 10 is removed by, for example, grinding.

Figure 21:
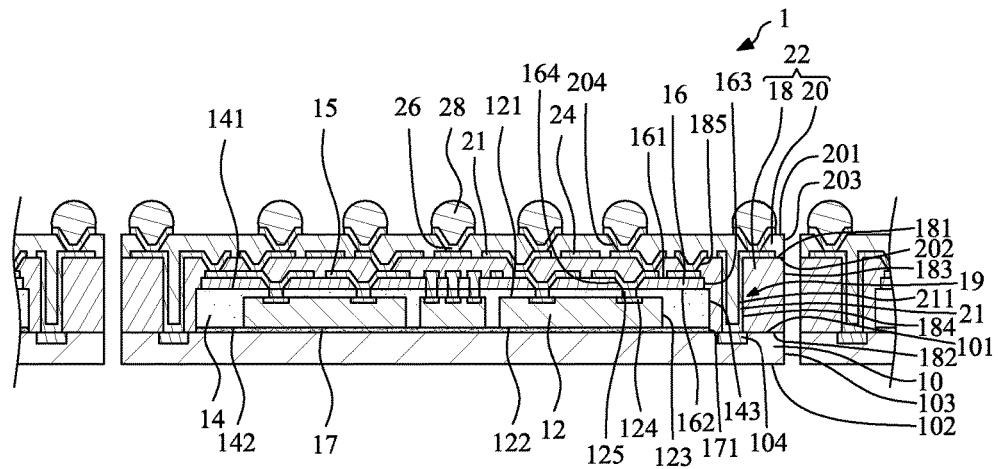
FIG. 21 illustrates one or more stages of some embodiments of a method for manufacturing a semiconductor package structure according to an aspect of the present disclosure.

Referring to FIG. 21, a singulation process is conducted by sawing the protection layer 22 (e.g., the first protection layer 18 and the second protection layer 20) and the semiconductor substrate 10 by blade along the cutting lines to form a plurality of semiconductor package structures 1 as shown in FIG. 1 and FIG. 2. In the semiconductor package structure 1, the second protection layer 20 further has a lateral surface 203 extending between the first surface 201 and the second surface 202. The first protection layer 18 further has a lateral surface 183 extending between the first surface 181 and the second surface 182. The semiconductor substrate 10 further has a lateral surface 103 extending between the first surface 101 and the second surface 102. The lateral surface 203 of the second protection layer 20, the lateral surface 183 of the first protection layer 18 and the lateral surface 103 of the semiconductor substrate 10 are substantially coplanar with each other.

Figure 22:
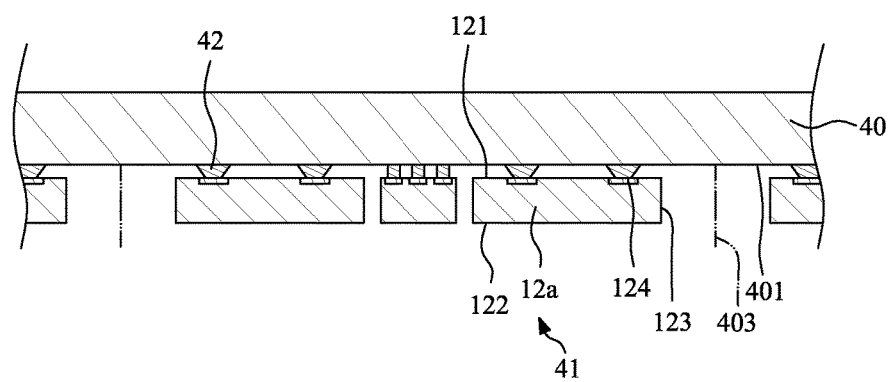
FIG. 22 illustrates one or more stages of some embodiments of a method for manufacturing a semiconductor package structure according to an aspect of the present disclosure.

FIG. 22 through FIG. 34 illustrate various stages of some embodiments of a method for manufacturing a semiconductor package structure according to an aspect of the present disclosure. In some embodiments, the method is for manufacturing a semiconductor package structure such as the semiconductor package structure 1d shown in FIG. 6. Referring to FIG. 22, a carrier 40 is provided. The carrier 40 may be, for example, a metal material, a ceramic material, a glass material, a substrate or a semiconductor wafer. The carrier 40 has a first surface 401. The carrier 40 may include a plurality of protrusions 42. The protrusions 42 may be formed or disposed on the first surface 401 of the carrier 40. Alternatively, the protrusions 42 and the carrier 40 may be formed integrally.

Then, a plurality of semiconductor dice 12a are disposed on the carrier 40. As shown in FIG. 22, three semiconductor dice 12a are disposed on the carrier 40 next to each other in a unit area 41 defined by the cutting lines 403; however, the number of the semiconductor die 12a may be one, two, four or more. In some embodiments, the sizes of the semiconductor dice 12a may be the same as or different from each other. The semiconductor die 12a has a first surface 121 (e.g., an active surface), a second surface (e.g., a back side surface) 122 and a lateral surface 123. The semiconductor die 12a may include a plurality of die pads 124. The die pads 124 may be exposed from the first surface 121, and the die pads 124 are disposed on a respective one of the protrusions 42. In other words, the first surface 121 of the semiconductor die 12a faces the first surface 401 of the carrier 40, and such process is referred to as a "face down process."

Figure 23:
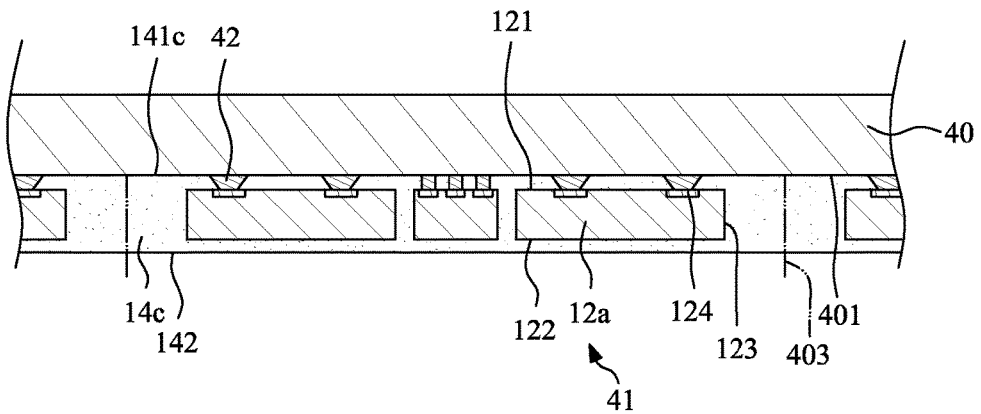
FIG. 23 illustrates one or more stages of some embodiments of a method for manufacturing a semiconductor package structure according to an aspect of the present disclosure.

Referring to FIG. 23, an encapsulant 14c is formed or disposed on the first surface 401 of the carrier 40 to cover the semiconductor dice 12a. The material of the encapsulant 14c may include a molding compound. The encapsulant 14c has a first surface 141c and a second surface 142 opposite to the first surface 141c. As shown in FIG. 23, the first surface 141c of the encapsulant 14c is higher than the first surface 121 of the semiconductor die 12a, so that the encapsulant 14c covers the first surface 121 and the lateral surface 123 of the semiconductor die 12a. Further, the second surface 142 of the encapsulant 14c is lower than the second surface 122 of the semiconductor die 12a, so that the encapsulant 14c further covers the second surface 122 of the semiconductor die 12a.

Figure 24:
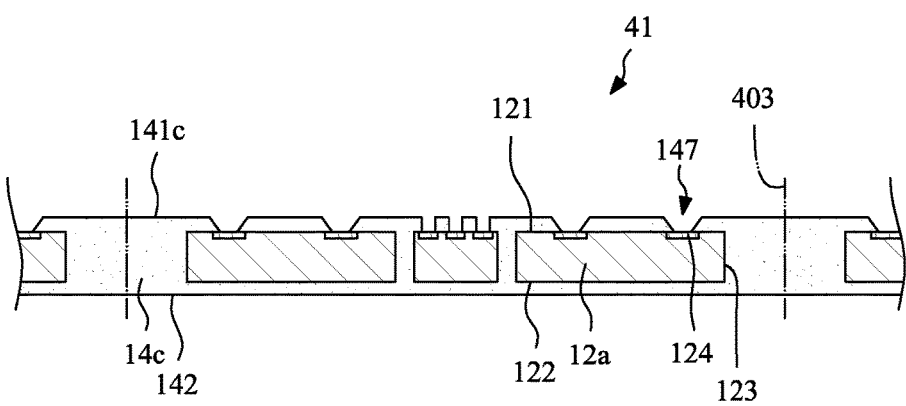
FIG. 24 illustrates one or more stages of some embodiments of a method for manufacturing a semiconductor package structure according to an aspect of the present disclosure.

Referring to FIG. 24, the carrier 40 is removed by, for example, stripping. Then, the protrusions 42 are removed by, for example, etching. Alternatively, if the protrusions 42 and the carrier 40 are formed integrally at the stage of FIG. 22, then, the protrusions 42 and the carrier 40 are removed concurrently. As shown in FIG. 24, the encapsulant 14c defines a plurality of openings 147 recessed from the first surface 141c. Each of the openings 147 of the encapsulant 14c exposes a respective one of the die pads 124 of the semiconductor die 12a. It is noted that the openings 147 may be formed by laser drilling.

Figure 25:
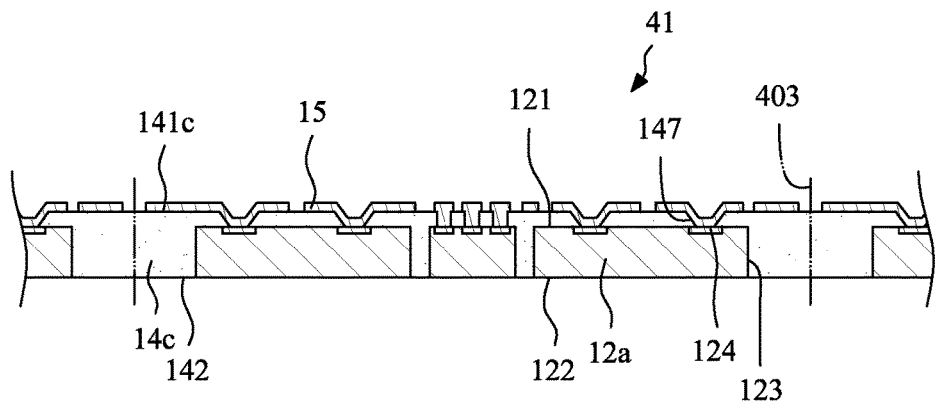
FIG. 25 illustrates one or more stages of some embodiments of a method for manufacturing a semiconductor package structure according to an aspect of the present disclosure.

Referring to FIG. 25, a bottom portion of the encapsulant 14c is removed by grinding so that the encapsulant 14c is thinned. A portion of the encapsulant 14c on the second surface 122 (e.g., backside surface) of the semiconductor die 12a is removed. Thus, the second surface 122 of the semiconductor die 12a is exposed from the second surface 142 of encapsulant 14c. The second surface 122 of the semiconductor die 12a is substantially coplanar with the second surface 142 of the encapsulant 14c.

Then, an interconnecting circuit layer 15 is formed or disposed on the first surface 141c of the encapsulant 14c and in the openings 147 so as to electrically and physically connect the die pads 124. Thus, the semiconductor dice 12 may be electrically connected to each other by the interconnecting circuit layer 15.

Figure 26:
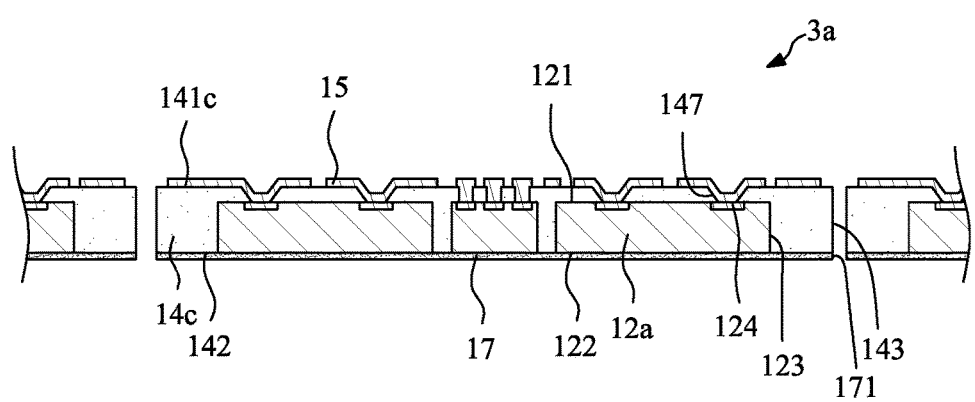
FIG. 26 illustrates one or more stages of some embodiments of a method for manufacturing a semiconductor package structure according to an aspect of the present disclosure.

Referring to FIG. 26, an adhesive layer 17 is formed or disposed on the second surface 142 of the encapsulant 14c and the second surface 122 of the semiconductor die 12a.

Then, a singulation process is conducted by sawing the encapsulant 14c and the adhesive layer 17 by blade along the cutting lines 403 to form a plurality of semiconductor devices 3a. The semiconductor devices 3a is a module, and includes the encapsulant 14c, the semiconductor dice 12a, the interconnecting circuit layer 15 and the adhesive layer 17. In the semiconductor devices 3a, the encapsulant 14c has a lateral surface 143 extending between the first surface 141c and the second surface 142, and the adhesive layer 17 has a lateral surface 171 that is substantially coplanar with the lateral surface 143 of the encapsulant 14.

Figure 27:
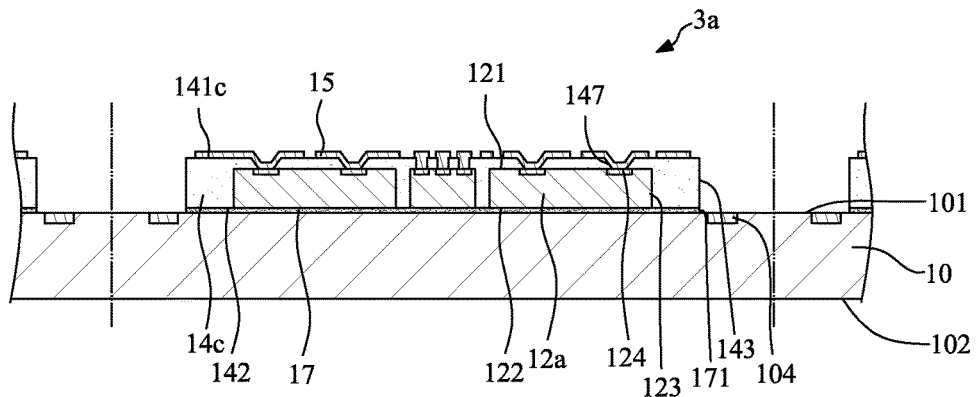
FIG. 27 illustrates one or more stages of some embodiments of a method for manufacturing a semiconductor package structure according to an aspect of the present disclosure.

Referring to FIG. 27, the semiconductor devices 3a are disposed on a semiconductor substrate 10. In some embodiments, the semiconductor devices 3a are adhered to the semiconductor substrate 10 through the adhesive layer 17. The semiconductor substrate 10 may be similar to the semiconductor substrate 10 of FIG. 14. The semiconductor substrate 10 has a first surface 101 and a second surface 102 opposite to the first surface 101. The semiconductor substrate 10 may include a plurality of pads 104 adjacent to the first surface 101. The pads 104 may be exposed from the first surface 101 and surround the encapsulant 14.

Figure 28:
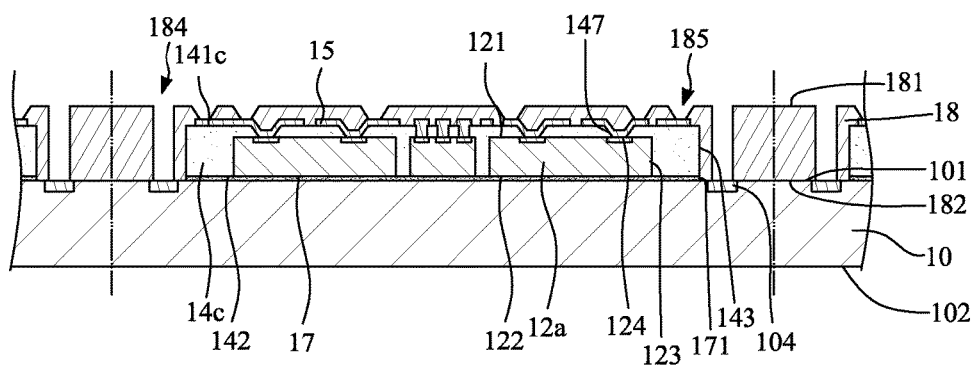
FIG. 28 illustrates one or more stages of some embodiments of a method for manufacturing a semiconductor package structure according to an aspect of the present disclosure.
Figure 29:
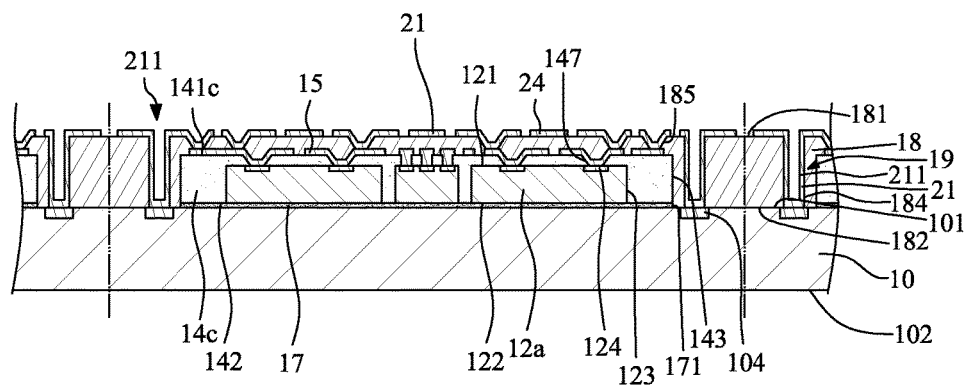
FIG. 29 illustrates one or more stages of some embodiments of a method for manufacturing a semiconductor package structure according to an aspect of the present disclosure.
Figure 30:
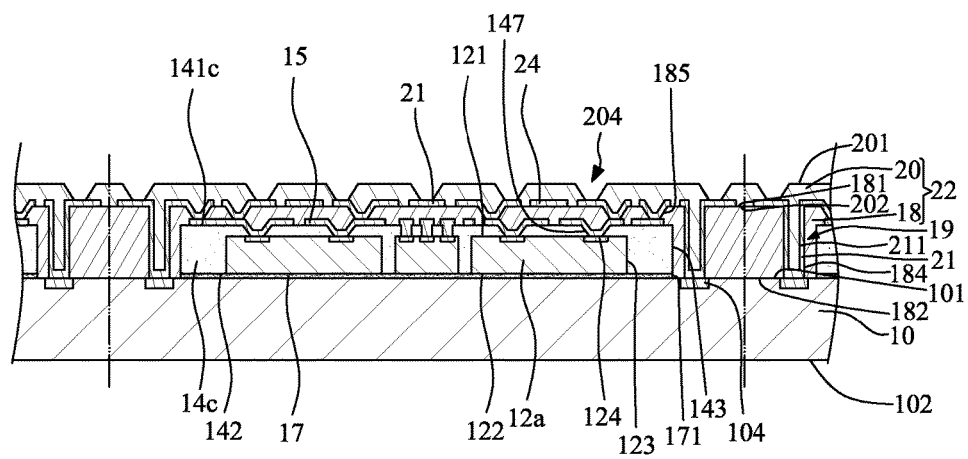
FIG. 30 illustrates one or more stages of some embodiments of a method for manufacturing a semiconductor package structure according to an aspect of the present disclosure.

Referring to FIG. 28 through FIG. 30, a protection layer 22 (including, for example, a first protection layer 18 and a second protection layer 20, as shown in FIG. 17), a plurality of conductive elements 19 and an RDL 24 are formed as follows, wherein the protection layer 22 covers the first surface 141c and the lateral surface 143 of the encapsulant 14c.

Referring to FIG. 28, the first protection layer 18 covers the semiconductor device 3a. The first protection layer 18 is formed or disposed on the first surface 141c of the encapsulant 14c and covers the interconnecting circuit layer 15. The first protection layer 18 covers and contacts the first surface 141c of the encapsulant 14c. The material of the first protection layer 18 may be different from the material of the encapsulant 14c. The first protection layer 18 has a first surface 181 and a second surface 182 opposite to the first surface 181. As shown in FIG. 28, the first protection layer 18 covers and contacts the lateral surface 143 of the encapsulant 14c and the lateral surface 171 of the adhesive layer 17. In addition, the second surface 182 the first protection layer 18 covers and contacts a portion of the first surface 101 of the semiconductor substrate 10. The first protection layer 18 defines a plurality of first openings 184 exposing the pad 104 of the semiconductor substrate 10 and a plurality of second openings 185 exposing portions of the interconnecting circuit layer 15.

Referring to FIG. 29, a metal layer 21 (e.g., a copper layer) is formed or disposed on the first surface 181 of the first protection layer 18 and in the first openings 184 and the second openings 185. A first portion of the metal layer 21 that is disposed in the first openings 184 forms the conductive elements 19 surrounding the lateral surface 143 of the encapsulant 14 of the semiconductor device 3. The conductive elements 19 are conductive vias that contact the pads 104 of the semiconductor substrate 10. As shown in FIG. 29, the first portion of the metal layer 21 is disposed on a side wall surface and a bottom surface of the first opening 184 of the first protection layer 18, and defines a cavity 211. A second portion of the metal layer 21 that is on the first surface 181 of the first protection layer 18 and in the second openings 185 is patterned to form the RDL 24. The RDL 24 is disposed on the first protection layer 18 and contacts the interconnecting circuit layer 15 in the second openings 185, so that the RDL 24 electrically connects the semiconductor die 12 of the semiconductor device 3 and the conductive elements 19.

Referring to FIG. 30, a second protection layer 20 is formed or disposed on the first surface 181 of the first protection layer 18, and covers the RDL 24 and the conductive elements 19. The second protection layer 20 has a first surface 201 and a second surface 202 opposite to the first surface 201. In some embodiments, a portion of the second protection layer 20 extends into and is disposed in the cavity 211 defined by the metal layer 21. As shown in FIG. 30, the second protection layer 20 defines a plurality of openings 204 to expose portions of the RDL 24.

Figure 31:
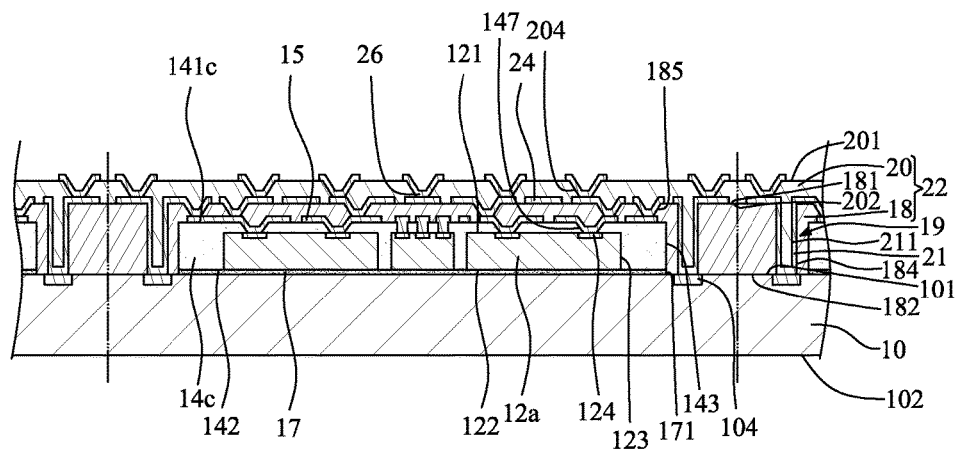
FIG. 31 illustrates one or more stages of some embodiments of a method for manufacturing a semiconductor package structure according to an aspect of the present disclosure.

Referring to FIG. 31, a plurality of UBM layers 26 are respectively formed or disposed in respective ones of the openings 204 of the second protection layer 20, and physically connected to the exposed RDL 24. It is noted that the UBM layers 26 may be included in another RDL.

Figure 32:
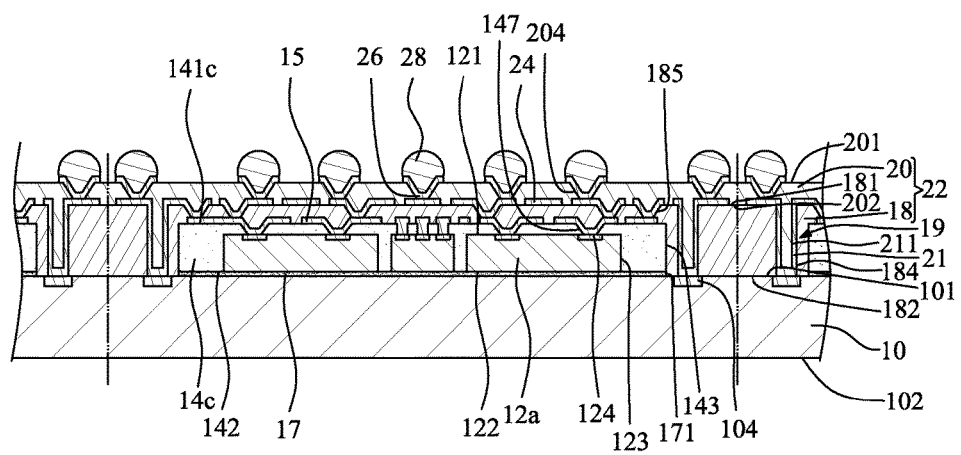
FIG. 32 illustrates one or more stages of some embodiments of a method for manufacturing a semiconductor package structure according to an aspect of the present disclosure.

Referring to FIG. 32, a plurality of solder balls 28 are respectively formed or disposed on respective one of the UBM layers 26 in the openings 204 for external connection, and are electrically connected to the RDL 24 through the UBM layers 26.

Figure 33:
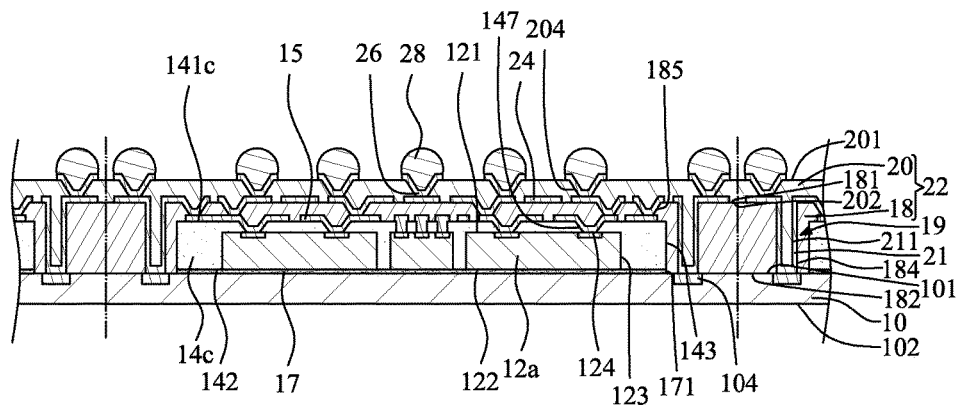
FIG. 33 illustrates one or more stages of some embodiments of a method for manufacturing a semiconductor package structure according to an aspect of the present disclosure.

Referring to FIG. 33, the semiconductor substrate 10 is thinned from its second surface 102. In other words, the bottom portion of the semiconductor substrate 10 is removed by, for example, grinding.

Figure 34:
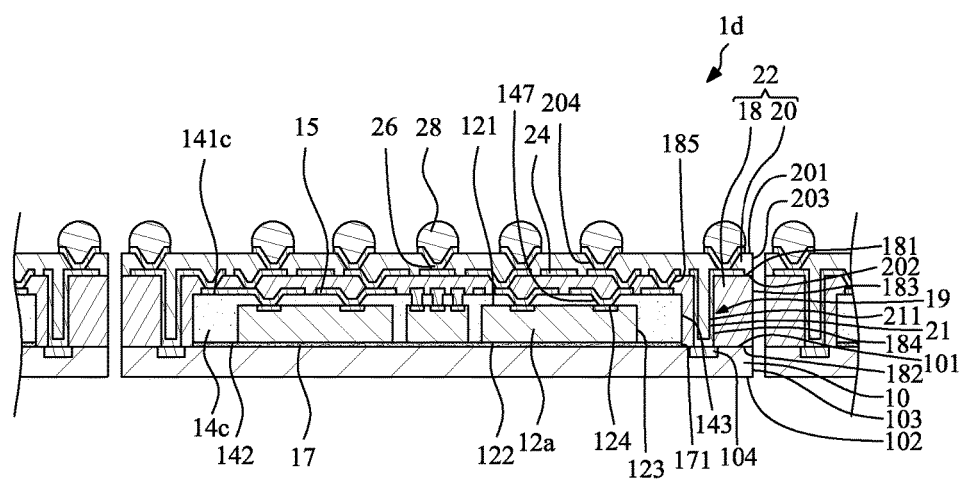
FIG. 34 illustrates one or more stages of some embodiments of a method for manufacturing a semiconductor package structure according to an aspect of the present disclosure.

Referring to FIG. 34, a singulation process is conducted by sawing the protection layer 22 (e.g., the first protection layer 18 and the second protection layer 20) and the semiconductor substrate 10 by blade along the cutting lines to form a plurality of semiconductor package structures 1d as shown in FIG. 6.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 µm, no greater than 2 µm, no greater than 1 µm, no greater than 0.5 µm, or no greater than 0.1 µm. A surface can be deemed to be planar or substantially planar if a difference between a highest point and a lowest point of the surface is no greater than 5 µm, no greater than 2 µm, no greater than 1 µm, no greater than 0.5 µm, or no greater than 0.1 µm.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package structure, comprising:
   a semiconductor substrate;
   at least one semiconductor die disposed on the semiconductor substrate;
   an encapsulant covering at least a portion of the at least one semiconductor die, wherein the encapsulant has a first surface and a lateral surface;
   a protection layer covering the first surface and the lateral surface of the encapsulant;
   a plurality of conductive elements surrounding the lateral surface of the encapsulant; and
   a redistribution layer electrically connecting the at least one semiconductor die and the conductive elements.

2. The semiconductor package structure of claim 1, wherein the semiconductor substrate includes a plurality of pads, and the plurality of pads surround the encapsulant.

3. The semiconductor package structure of claim 1, wherein a value of a surface roughness of the lateral surface of the encapsulant is greater than a value of a surface roughness of the first surface of the encapsulant.

4. The semiconductor package structure of claim 1, wherein the protection layer covers the conductive elements.

5. The semiconductor package structure of claim 1, wherein at least one of the conductive elements includes a metal layer defining a cavity.

6. The semiconductor package structure of claim 5, wherein a portion of the protection layer is disposed in the cavity.

7. The semiconductor package structure of claim 5, wherein the protection layer defines an opening, and the metal layer is disposed on a side wall surface and a bottom surface of the opening.

8. The semiconductor package structure of claim 1, wherein the protection layer includes a first protection layer and a second protection layer, the first protection layer covers the first surface and the lateral surface of the encapsulant, the conductive elements and the redistribution layer are disposed on the first protection layer, and the second protection layer is disposed on the first protection layer and covers the conductive elements and the redistribution layer.

9. The semiconductor package structure of claim 8, wherein a material of the first protection layer is the same as a material of the second protection layer.

10. The semiconductor package structure of claim 1, further comprising an adhesive layer disposed between the encapsulant and the semiconductor substrate.

11. The semiconductor package structure of claim 10, wherein a lateral surface of the adhesive layer and a lateral surface of the encapsulant are substantially coplanar with each other.

12. The semiconductor package structure of claim 1, wherein the conductive elements electrically connect the at least one semiconductor die and the semiconductor substrate.

13. The semiconductor package structure of claim 1, wherein the conductive elements and the redistribution layer are integrally formed.

14. The semiconductor package structure of claim 1, wherein the at least one semiconductor die has a first surface, a second surface and a lateral surface, the encapsulant covers the first surface and the lateral surface of the semiconductor die, and the second surface of the semiconductor die is substantially coplanar with a second surface of the encapsulant.

15. The semiconductor package structure of claim 1, wherein the at least one semiconductor die includes a plurality of conductive pillars each having a respective top surface and a respective peripheral surface, the encapsulant covers the respective peripheral surfaces of the conductive pillars, and the respective top surfaces of the conductive pillars are exposed from the encapsulant.

16. The semiconductor package structure of claim 15, wherein the respective top surfaces of the conductive pillars are substantially coplanar with the first surface of the encapsulant.

17. The semiconductor package structure of claim 1, further comprising an interconnecting circuit layer electrically connecting the redistribution layer and the at least one semiconductor die, wherein a line width/line space (L/S) of the redistribution layer is greater than an L/S of the interconnecting circuit layer.

18. The semiconductor package structure of claim 11, further comprising a passivation layer disposed between the protection layer and the encapsulant.

19. The semiconductor package structure of claim 18, wherein the passivation layer has a lateral surface that is displaced from the lateral surface of the encapsulant.

20. The semiconductor package structure of claim 19, wherein the protection layer covers and contacts the lateral surface of the passivation layer, the lateral surface of the encapsulant and the lateral surface of the adhesive layer.

* * * * *